(12) United States Patent
Yao et al.

(10) Patent No.: US 8,216,869 B2
(45) Date of Patent: Jul. 10, 2012

(54) GROUP III NITRIDE SEMICONDUCTOR AND A MANUFACTURING METHOD THEREOF

(75) Inventors: Takafumi Yao, Miyagi (JP);
Meoung-Whan Cho, Miyagi (JP);
Ryuichi Toba, Tokyo (JP)

(73) Assignee: Dowa Electronics Material Co., Ltd., Tokyo (JP)

( * ) Notice: Subject to any disclaimer, the term of this patent is extended or adjusted under 35 U.S.C. 154(b) by 182 days.

(21) Appl. No.: 12/230,284

(22) Filed: Aug. 27, 2008

(65) Prior Publication Data
US 2009/0057835 A1   Mar. 5, 2009

(30) Foreign Application Priority Data
Aug. 28, 2007   (JP) ................................ 2007-221774

(51) Int. Cl.
*H01L 21/00* (2006.01)
(52) U.S. Cl. .......... 438/46; 438/483; 257/613; 257/615; 257/E21.108
(58) Field of Classification Search .............. 438/22–47, 438/483; 257/615, E21.108, 613
See application file for complete search history.

(56) References Cited

U.S. PATENT DOCUMENTS

| | | | | |
|---|---|---|---|---|
| 2001/0012678 A1 | * | 8/2001 | Tanaka et al. | 438/481 |
| 2007/0085093 A1 | * | 4/2007 | Ohmae et al. | 257/89 |
| 2007/0141823 A1 | * | 6/2007 | Preble et al. | 438/604 |
| 2007/0205407 A1 | * | 9/2007 | Matsuo et al. | 257/13 |
| 2008/0261378 A1 | | 10/2008 | Yao et al. | |
| 2008/0299746 A1 | | 12/2008 | Yao et al. | |

FOREIGN PATENT DOCUMENTS

| | | |
|---|---|---|
| WO | WO 2006/126330 | 11/2006 |
| WO | WO 2007/023911 | 3/2007 |
| WO | WO 2007/072984 | 6/2007 |

OTHER PUBLICATIONS

Japanese Office Action dated Dec. 20, 2011.

* cited by examiner

*Primary Examiner* — Khiem D Nguyen
(74) *Attorney, Agent, or Firm* — Pillsbury Winthrop Shaw Pittman, LLP

(57) ABSTRACT

A manufacturing method of a group III nitride semiconductor includes the steps of: depositing a metal layer on an AlN template substrate or an AlN single crystal substrate formed by depositing an AlN single crystal layer with a thickness of not less than 0.1 μm nor more than 10 μm on a substrate made of either one of sapphire, SiC, and Si; forming a metal nitride layer having a plurality of substantially triangular-pyramid-shaped or triangular-trapezoid-shaped microcrystals by performing a heating nitridation process on the metal layer under a mixed gas atmosphere of ammonia; and depositing a group III nitride semiconductor layer on the metal nitride layer.

17 Claims, 11 Drawing Sheets

FIG.9 (A)
FIG.9 (B)
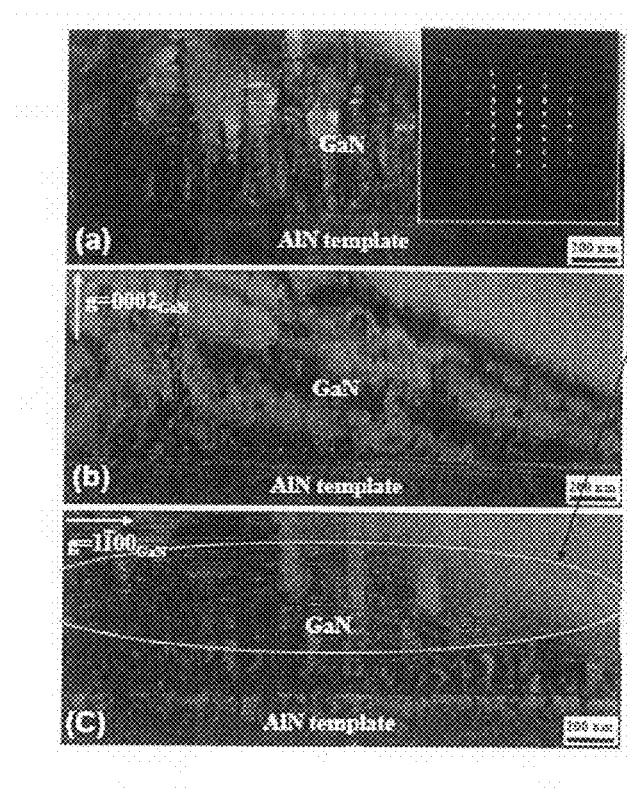
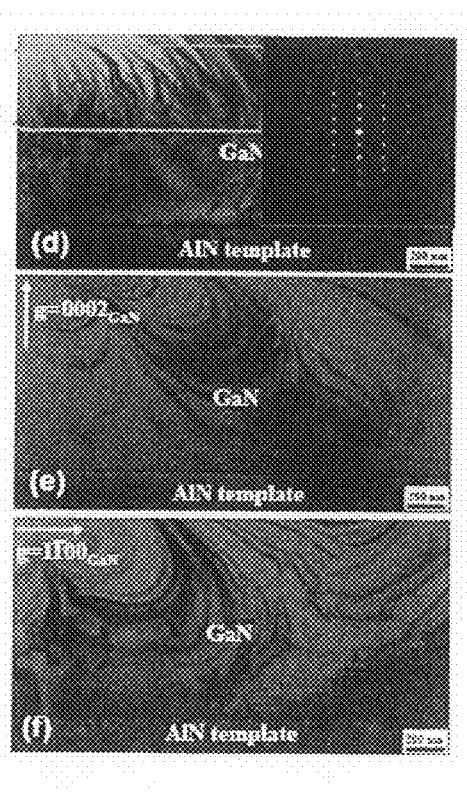

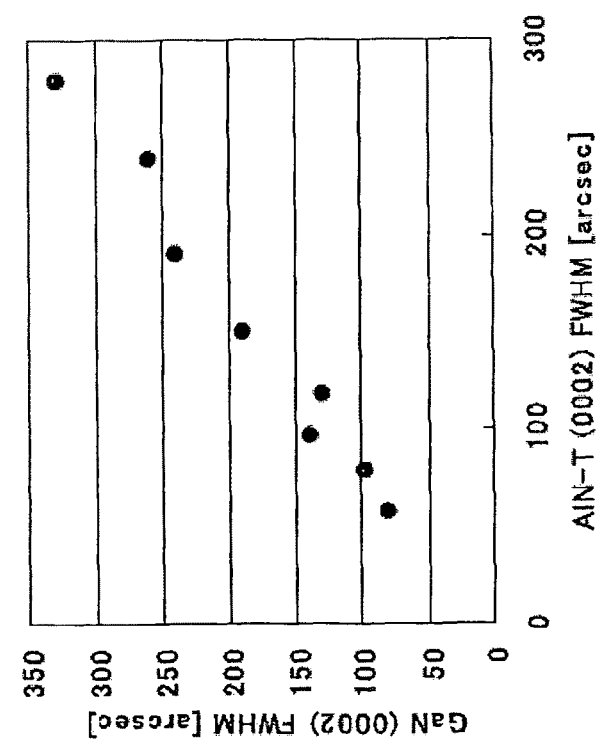
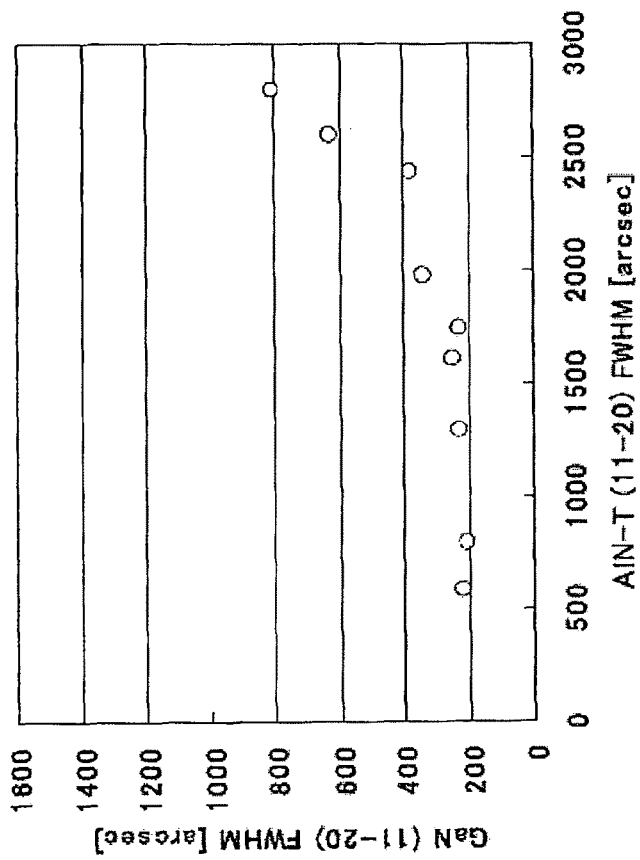
FIG.10 a)
FIG.10 b)

GROUP III NITRIDE SEMICONDUCTOR AND A MANUFACTURING METHOD THEREOF

BACKGROUND OF THE INVENTION

1. Field of the Invention

The present invention relates to a group III nitride semiconductor having a reduced dislocation density and a manufacturing method thereof, and further relates to a group III nitride independent substrate separated from a base substrate.

2. Description of the Related Art

A group III nitride semiconductor has been put to practical use as a material for manufacturing a light emitting device, an electronic device and the like, and has been paid attention for the use in a region which could not be covered by a conventional semiconductor material.

Normally, in order to manufacture those devices, a group III nitride semiconductor layer is epitaxially grown on a substrate crystal. When Si, GaAs or the like is applied, a wafer having a large diameter and a low defect density is commercially manufactured as the substrate crystal, which enables to manufacture a lattice-matching type device. However, when the group III nitride semiconductor is applied, since no homoepitaxial substrates having good quality and being inexpensive do not exist, a heterogeneous substrate such as a sapphire substrate having a different lattice constant, a thermal expansion coefficient, and the like has to be normally used in substitution for the homoepitaxial substrate under the present situation. For this reason, a dislocation density of about $10^9$ to $10^{10}/cm^2$ is normally introduced into a group III nitride semiconductor crystal grown on the sapphire substrate.

A blue LED (Light Emitting Diode) can realize a high efficient light emission specifically even under the situation of the high dislocation density, but, it is found that this is contributed by a composition fluctuation of In in a light emitting layer. However, a blue-violet laser with an emission wavelength of 405 nm used as a light source of a next-generation DVD is operated in an incommensurably higher current injection density than the LED, so that a dislocation existing in a light emitting stripe and being a non-light emission center increases, which creates a problem regarding a life deterioration in which a light emission efficiency rapidly decreases. Further, regarding a light emitting element in an ultraviolet region, since there is a limit in an adding amount of In on the ground of mixed crystal composition, as the wavelength of the element becomes shorter, more problems in the efficiency and the decrease of the operating life due to the dislocation to be the non-light emission center are created. Furthermore, also in a bipolar type electronic device element, an increase of a leak current, a deterioration of element characteristic, and the like caused by the existence of the dislocation become problems. Therefore, a reduction in the dislocation density is a big task ("Widegap Semiconductor Optoelectronic Devices" editorially supervised by Kiyoshi TAKAHASHI, edited and written by Fumio HASEGAWA and Akihiko YOSHIKAWA, published by Morikita Publishing Co., Ltd. (March, 2006)).

Meanwhile, there is a need to improve characteristics of the various devices, and to realize a high-power, for instance, there is a need to improve a heat release performance. This becomes an important subject in future investigation especially in an LED used for illumination and for a head lamp of a car and in a high-frequency/high-power device. Specifically, it is required to reduce a heating value by improving an efficiency in an operation section, and to efficiently diffuse the generated heat. To satisfy the former requirement, a measure such that a reduction in a crystal defect and an optimization of an element structure can be done, and to satisfy the latter requirement, a measure such that the optimization of the element structure similarly as above, a reduction in the thickness of a base substrate by a grinding, a separation of a crystal layer from a low-heat conductivity substrate to transfer it to a high-heat conductivity substrate, or the use of the high-heat conductivity substrate can be done.

Heat conductivities in the vicinity of a room temperature of typical semiconductor substrate materials are 150 W/mK (Si), 50 W/mK (GaAs), 42 W/mK (sapphire), and 450 W/mK (SiC), and since the sapphire substrate normally used as the group III nitride semiconductor has a low-heat conductivity, there is proposed, as the aforementioned measure, a method to separate a grown crystal layer from the sapphire substrate using a laser lift-off method. Further, if GaN (230 W/mK) and AlN (330 W/mK) having good heat conductivities can be used as the substrates, it is expected to obtain an effect of reducing the crystal defect and to be advantageous in terms of heat release, but, there is a problem that there exists no substrates being inexpensive with good quality under the present situation (W. S. Wong et al., "Damage-free separation of GaN thin films from sapphire substrates" Appl. Phys. Lett. 72 (1998) P. 599, and "IMEC improves GaN HEMTs" Compound Semiconductor, October (2005) P. 16).

In order to reduce the dislocation density of the group III nitride semiconductor crystal grown on the sapphire substrate, an improvement of a group III nitride buffer layer, a control of a propagation of a threading dislocation from a base substrate by a lateral growth on an insulating film called an ELO (Epitaxial Lateral Overgrowth), a control of a propagation of the threading dislocation from the base substrate by a method called PENDEO-epitaxy method in which a group III nitride type layer is disposed on an upper surface of a convex portion of a concave and convex processing substrate and is grown in a hollow portion from a side surface of the substrate in a lateral direction, and so on are proposed. Although depending on a growth film thickness, the dislocation density can be reduced by about one to two digits with the use of those methods. Further, in GaN, since the dislocation is eliminated because of a reaction of each dislocation along with the progress of formation of the crystal layer and thus the dislocation density is lowered, there has been developed a thick film crystal having a low dislocation density using an HVPE (Hidride Vapor Phase Epitaxy) method capable of performing a high-speed epitaxy. If the thick film crystal is grown to have a thickness of about several hundreds of μm to 1 mm, the dislocation density can be decreased to a value of a digit of $10^7$ to $10^6/cm^2$, so that it has been developed and manufactured especially for the use of the independent substrate and a template substrate. However, to obtain the independent substrate, the aforementioned laser lift-off method is applied, specifically, GaN on an interface is decomposed by a nanosecond pulse irradiation of an excimer laser of 248 nm from a back surface side of the sapphire substrate to thereby separate the GaN from the substrate. In this case, there are a lot of problems in the yield such that the entire surface cannot be perfectly peeled off and a crack is generated, which becomes a main cause for increasing a cost (Amano, et al., "Effect of low-temperature-deposited layer on the growth of group III nitrides on sapphire" Applied Physics vol. 68 (1999) P. 768, A. Sakai, et al., "Defect structure in selectively grown GaN films with low threading dislocation density" Appl. Phys. Lett. 71 (1997) P. 2259, K. Linthicum et al., "Pendeoepitaxy of gallium nitride thin films" Appl. Phys. Lett. 75 (1999) P.

196, and S. K. Mathis et al., "Modeling of threading dislocation in growing GaN layer" J. Crystal Growth 231 (2001) P. 371).

SUMMARY OF THE INVENTION

Incidentally, the present inventors have proposed a technique of manufacturing an independent substrate or an individual semiconductor chip by forming a metal nitride buffer layer of a specific metal type on a sapphire substrate under a predetermined condition in which a GaN single crystal layer grown on the metal nitride buffer layer has the same or better crystallinity compared to a crystallinity of GaN on a sapphire substrate formed by using a conventional AlN or GaN low temperature buffer layer, and by selectively performing a chemical etching on the metal nitride buffer layer to thereby separate the base sapphire substrate and the grown layer. When a metal Cr layer with a thickness of 10 nm to 40 nm is deposited on a sapphire (0001) substrate and nitrided in an atmosphere of gas containing ammonia at a temperature of 1040° C. or higher, or when CrN is formed by an MOCVD method and GaN is grown thereon by an HVPE method, an FWHM (Full Width at Half Maximum) of a (0002) diffraction of an XRD (X-Ray Diffraction) to be an index of a fluctuation of a C axis (Tilt) falls within a range of about 240 seconds to 560 seconds, and an FWHM of a (10-11) or (11-20) diffraction to be an index of a rotation fluctuation within a C surface (Twist) falls within a range of about 370 seconds to 650 seconds. The grown CrN buffer layer can be selectively etched by a mixed solution of, for example, perchloric acid and ceric ammonium nitrate, so that the separation of the independent substrate or the individual semiconductor chip from the sapphire substrate, namely, a chemical lift-off can be performed.

As described above, a method capable of performing the selective etching on the sapphire substrate and capable of helping the growth of the group III nitride semiconductor crystal was found, but, a further reduction in the crystal defect and a reduction in time taken for separating the base substrate from the grown layer using the selective etching can be cited as tasks. Specifically, regarding the crystal defect, a reliability such as the element characteristic and the operating life is desired to be further improved, so that there is a need to continuously decrease the dislocation density. When the metal nitride buffer layer on the sapphire substrate is CrN, the crystallinity takes an optimal value when the film thickness of the metal Cr is 15 nm to 30 nm, and although the single crystal layer of GaN can be obtained until the film thickness of the metal Cr becomes about 45 nm, when the film thickness is beyond 50 nm, the crystallinity of the CrN layer after the nitridation process is largely deteriorated, and GaN grown on the CrN layer becomes mosaiced or polycrystallized.

A time required for the chemical lift-off becomes shorter as the CrN film thickness becomes thicker, but, it can be realized by trading off the security of crystallinity, and it is a problem to be improved especially when enlarging an area of the independent substrate. An etching speed is influenced by a liquid composition, a liquid temperature, a stirring condition and the like, so that it is hard to be represented by a numeric value in general, and, when the Cr deposition thickness is 20 nm, a time of about 10 to 15 minutes is required to perform the chemical lift-off on a 300 µm square chip, and a time of several tens of hours is required to perform the chemical lift-off on the independent substrate with a diameter of 2 inches. Regarding the former case, the time is conceivable to fall within a tolerable range as a processing time, but, regarding the latter case, the time needs to be improved. When enlarging the area, since an in-plane distribution of the Cr film thickness to be deposited tends to be increased, to avoid a partial pit generation and the polycrystallization, the thickness condition of Cr is set to a safe side (middle thickness or slightly thinner thickness under an optimum condition) by considering a process margin, which is a problem, and a task is to realize to keep improving the crystallinity even of a thicker metal nitride buffer layer. Regarding a case of the blue LED and the like in which the decrease of light emission efficiency caused by the dislocation can be largely suppressed thanks to the composition fluctuation of In, as long as the crystallinity does not deteriorate, a removability rather than the dislocation density may be regarded as most important, but, when the Cr layer is thick, the GaN layer is polycrystallized on the sapphire substrate, which is a big problem.

An object of the present invention is to provide a method capable of further reducing a dislocation density of a group III nitride semiconductor and capable of largely reducing a time required especially for a chemical lift-off performed when manufacturing an independent substrate.

According to the present invention, there is provided a manufacturing method of a group III nitride semiconductor including the steps of: depositing a metal layer on an AlN template substrate or an AlN single crystal substrate formed by depositing an AlN single crystal layer with a thickness of not less than 0.1 µm nor more than 10 µm on a substrate made of either one of sapphire, SiC, and Si; forming a metal nitride layer having a plurality of substantially triangular-pyramid-shaped or triangular-trapezoid-shaped microcrystals by performing a heating nitridation process on the metal layer under a mixed gas atmosphere of ammonia; and depositing a group III nitride semiconductor layer on the metal nitride layer.

This manufacturing method may further include a step of forming an independent substrate or a semiconductor element of the group III nitride semiconductor by dissolving and removing the metal nitride layer using a chemical etching and separating the template substrate or the AlN single crystal substrate from the group III nitride layer. Further, an FWHM of a (0002) X-ray rocking curve of the AlN template substrate or the AlN single crystal substrate may be 200 seconds or less, and an FWHM of (11-20) may be 2500 seconds or less. Further, the metal layer may be either one of a single layer film, a multilayer film and an alloy film containing at least one kind or more selected from Cr, V, Zr, Nb and Ti. Further, a heating nitridation temperature under the mixed gas atmosphere of ammonia may be within a range of 900 to 1200° C. and a nitridation time may be not less than 1 minute nor more than 90 minutes. Further, an average thickness of the metal layer before the heating nitridation process may fall within a range of 4 to 300 nm.

Further, according to the present invention, there is provided a group III nitride semiconductor formed of a group III nitride semiconductor layer deposited on a metal nitride layer, in which the metal nitride layer has a plurality of substantially triangular-pyramid-shaped or triangular-trapezoid-shaped microcrystals, and is formed by performing a heating nitridation process under a mixed gas atmosphere of ammonia on a metal layer deposited on an AlN template substrate or an AlN single crystal substrate formed by depositing an AlN single crystal layer with a thickness of not less than 0.1 µm nor more than 10 µm on a substrate made of either one of sapphire, SiC, and Si.

In the group III nitride semiconductor, an FWHM of a (0002) X-ray rocking curve of the AlN template substrate or the AlN single crystal substrate may be 200 seconds or less, and an FWHM of (11-20) may be 2500 seconds or less. Further, the metal nitride may contain at least one kind or more selected from Cr, V, Zr, Nb and Ti. Further, an average thickness of the metal nitride layer may fall within a range of 6 to 450 nm.

Further, according to the present invention, there is provided a group III nitride independent substrate formed by dissolving and removing the metal nitride layer from the group III nitride semiconductor using a chemical etching and having a substantially triangular-pyramid-shaped or triangular-trapezoid-shaped pit or dent on a (000-1) N (nitrogen) polarity surface.

Further, according to the present invention, there is provided a group III nitride semiconductor element having a substantially triangular-pyramid-shaped or triangular-trapezoid-shaped pit or dent on a (000-1) N (nitrogen) polarity surface being a surface from which the metal nitride layer in the group III nitride semiconductor is dissolved and removed by a chemical etching. For instance, as the group III nitride semiconductor element, a light emitting element or the like can be cited as an example.

The present inventors found a method of obtaining a group III nitride semiconductor in which a metal nitride layer which can be chemically lifted off is formed on a sapphire substrate. When the present inventors applied the aforementioned method on AlN, a greater-than-expected result was obtained.

A case where a metal is Cr is described as an example.

(1) Compared to a case where Cr on a sapphire (0001) substrate is nitrided to be CrN, when Cr on AlN (0001) is nitrided to be CrN, a crystallinity of the CrN itself was remarkably improved. As an example, a comparison in a case where an initial Cr film thickness is 20 nm, a nitridation temperature is 1080° C., and a nitridation time is 30 minutes is shown in FIGS. 1-a and 1-b. The FWHM of a Cr (111) diffraction of the XRD on the sapphire substrate (FIG. 1-a)) and that on the AlN (FIG. 1-b)) are respectively 4059 sec and 347 sec, in which the FW can be reduced by one digit or more.

(2) A processing time required to nitride Cr and further to improve the crystallinity of CrN to a predetermined level or higher by rearranging an atomic arrangement is very short on the AlN (0001) compared to on the sapphire (0001) substrate. As an example, a result of the Cr (111) diffraction (FIG. 1-c)) of the XRD on the AlN (0001) which is processed under the same condition as described above except that the nitridation processing time is 3 minutes is shown, in which it is confirmed that even the FWHM is 624 sec being one-tenth of the nitridation processing time, the crystallinity on the AlN (0001) becomes better than that on the sapphire substrate. Although a scholarly reason is unclear, it is assumed that the AlN (0001) surface has a larger driving force (influence) with respect to a solid phase epitaxial growth (rearrangement of atoms) from the base substrate.

On the sapphire (0001) substrate, when the Cr film thickness becomes 50 nm or larger, the CrN after the nitridation cannot achieve the crystallinity required for growing the GaN single crystal using the HVPE method, resulting that the GaN single crystal becomes mosaiced or polycrystallized. On the other hand, on the AlN (0001) surface, a single crystal growth of GaN was found to be realized even when the Cr film thickness is made thick as much as about 300 nm. This is assumed to be associated with that the driving force with respect to the CrN solid phase epitaxial growth of the AlN (0001) surface is larger than that of the sapphire substrate, as described above. Since the Cr film thickness, namely, the CrN film thickness after the nitridation can be made thick, it is possible to largely reduce the etching time of the chemical lift-off.

By optimizing the Cr film thickness on the AlN (0001) and the nitriding condiction, the GaN crystal grown on the Cr film by the HVPE method can obtain a good crystallinity in which the FWHM of the (0002) diffraction of the XRD to be the index of the fluctuation of the C axis is 150 sec or less, and the FWHM of the (11-20) diffraction of the XRD to be the index of the rotation fluctuation within the C surface is 250 sec or less. These XRD FWHMs are reduced as much as about one-third of those in GaN grown on a CrN buffer layer on the sapphire (0001) substrate under the same condition. Further, compared to a case where a GaN layer is directly grown on the AlN (0001) using the HVPE method, it is possible to reduce the FWHM of the XRD (11-20) diffraction even the Cr film thickness is made thick as much as about 300 nm.

Group III nitride semiconductors with low dislocation densities can be produced in large quantities by using AlN templates or AlN single crystal substrates, and with the use of a manufacturing method capable of performing a chemical lift-off, an independent substrate and a semiconductor element of the group III nitride semiconductor with low dislocation density can be obtained.

BRIEF DESCRIPTION OF THE DRAWINGS

FIG. 9(A) are explanatory views of observation results of dislocations using cross sections TEM in a case where GaN layers are directly grown on the AlN (0001), in which FIGS. 9(Aa), 9(Ab) and 9(Ac) show results obtained by the observations while changing measuring directions (g values);

FIG. 9(B) are explanatory views of observation results of dislocations using cross sections TEM in a case where Cr layers are deposited on the AlN (0001) and made to be CrN by a nitridation process and GaN layers are grown thereon, in which FIGS. 9(Bd), 9(Be) and 9(Bf) show results obtained by the observations while changing measuring directions (g values);

FIG. 10(a) is a graph showing a relationship between an FWHM of an AlN (0002) diffraction and a GaN (0002) FWHM;

FIG. 10(b) is a graph showing a relationship between an FWHM of an AlN (11-20) diffraction and a GaN (11-20) FWHM;

DETAILED DESCRIPTION OF THE INVENTION

Figure 1:
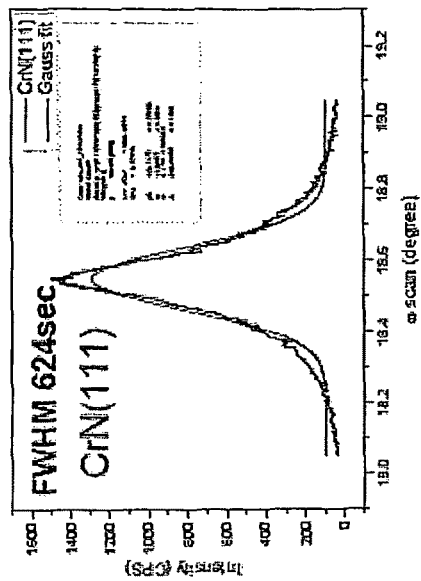
FIG. 1(a) is a graph showing a CrN (111) diffraction pattern of an XRD of a sample in which Cr (20 nm) on a sapphire substrate is subjected to a nitridation process at 1080° C. for 30 minutes.
FIG. 1(b) is a graph showing a CrN (111) diffraction pattern of the XRD of a sample in which Cr (20 nm) on an AlN template is subjected to the nitridation process at 1080° C. for 30 minutes.
FIG. 1(c) is a graph showing a CrN (111) diffraction pattern of the XRD of a sample in which Cr (20 nm) on the AlN template is subjected to the nitridation process at 1080° C. for 3 minutes.
Figure 1:
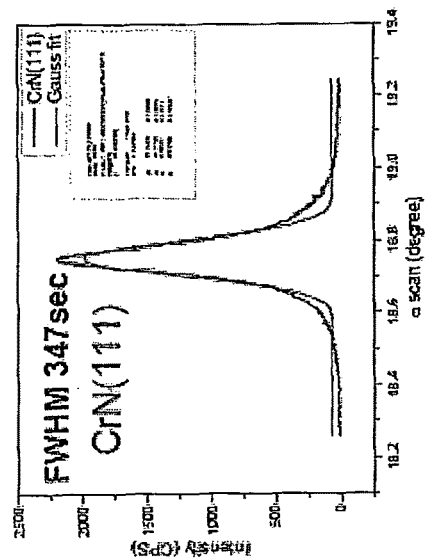
Figure 1:
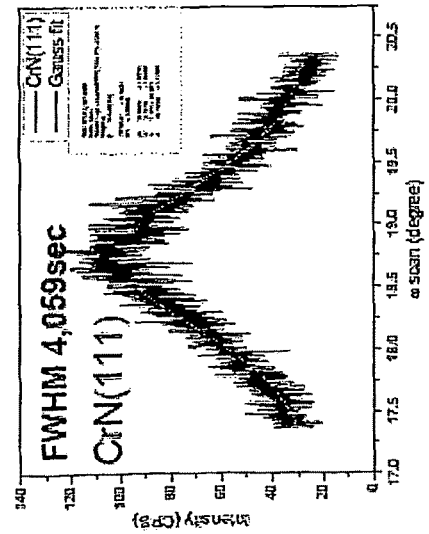

Hereinafter, a preferred embodiment of the present invention will be described with reference to the drawings. In the specification and the drawings, the same reference numerals and symbols are used to designate constituent elements having substantially the same functional structures, and redundant description thereof will be omitted.

A manufacturing process when a metal nitride is used as a buffer layer to form a group III nitride semiconductor layer is simply described, and subsequently, a preferred embodiment will be explained. Note that a semiconductor layer mentioned here includes a single layer or a state of being stacked.

First, a metal layer with a predetermined thickness is deposited on a base substrate for growth using a predetermined metal with a sputtering method, a vacuum deposition method, or the like. Next, it is introduced into a group III nitride semiconductor growing apparatus, for example, an HVPE growing apparatus, and a temperature starts to be raised in an atmosphere of high-purity hydrogen gas or nitrogen gas. Nitrogen hydride such as ammonia gas and hydrazine gas starts to be supplied at a predetermined temperature, specifically, around a temperature at which a nitridation reaction starts occurring in the used metal, the temperature is further raised to a nitridation processing temperature, and at the temperature, the nitridation process is carried out for a predetermined period of time to change the metal layer into a metal nitride buffer layer used for depositing the group III nitride semiconductor layer. Normally, when depositing the group III nitride semiconductor layer on a sapphire substrate, an SiC substrate and an Si substrate, a low-temperature buffer layer for the group III nitride semiconductor is formed, but, this is unnecessary in this method.

Next, the temperature is adjusted to a growth temperature of the group III nitride semiconductor, group III raw material gas starts to be supplied, thereby starting the film deposition. A film deposition temperature, a kind of the supplied gas, a flow ratio and the like are appropriately changed in the middle of the growth according to a layer structure to be grown, and at a stage where the intended film deposition completes, a cooling is started. When the temperature reaches a predetermined temperature in the middle of the cooling, the supply of the ammonia gas and the hydrazine gas is stopped, a cooling is performed in an atmosphere of high-purity hydrogen gas or nitrogen gas, thereby completing the growth process.

As an example of manufacturing the group III nitride semiconductor and an independent substrate or a semiconductor element of the group III nitride semiconductor, an AlN single crystal layer is formed as a first layer on a sapphire ($Al_2O_3$) substrate (hereinafter, refer to as an AlN template). Other than the sapphire substrate, a substrate capable of applied to a desired semiconductor such as an SiC substrate and an Si substrate can be used. Further, an AlN single crystal substrate can also be used. Further, as a layer having a small ratio of lattice mismatch with the group III nitride semiconductor, AlGaN and GaN can also be selected other than AlN. In the present embodiment, a template substrate in which an AlN single crystal layer with a thickness of about 1 μm is deposited on a sapphire (0001) surface by an MOCVD method is used. The used AlN template has about 100 sec of an FWHM of an XRD in a (0002) diffraction and about 1200 sec to 1400 sec of an FWHM in a (11-20) diffraction.

The predetermined metal layer is required to satisfy a condition as a buffer layer to grow the group III nitride semiconductor layer at a stage where it is nitrided by the nitrogen hydride such as the ammonia gas and the hydrazine gas. Specifically, it is required that the metal layer is aligned not randomly but in a predetermined orientation with respect to a vertical direction of a base layer or a base substrate surface, and that it is not twisted with respect to the base layer or within the surface of the base substrate at the time of being nitrided. Namely, there is no point if the metal layer is just oriented to the direction vertical to the base, and a domain rotation fluctuation within the surface also has to be suppressed. It is required that on an AlN (0001) c surface, the metal nitride takes a sodium chloride structure or a hexagonal structure, in which the direction vertical to the base is <111> direction in the former case and <0001> direction in the latter case, and with respect to in the surface of the base, bases of a triangle in the former case, and a axes in the latter case are parallel to a-axis directions in the AlN (0001) surface. Preferably, the metal layer has an inter-atomic distance being approximated to a lattice constant of the a axis in the AlN (0001) surface, and further preferably, it has a heat resistance to the growth temperature of the group III nitride semiconductor, hardly generates a mutual diffusion, an alloying and the like, and has a thermal expansion coefficient approximated to that of the AlN (0001) surface. The above are the requirements necessary for improving the crystallinity of the group III nitride semiconductor crystal.

Further, when separating the base layer or the base substrate from the group III nitride semiconductor layer using a chemical lift-off method, the presence/absence of a chemical solution which selectively performs a chemical etching only on the metal nitride layer being the buffer layer without damaging a joining metal or an alloy used in the group III nitride semiconductor layer and used for a transfer, also becomes an important selection requirement.

As metals satisfying these requirements, Cr, V, Zr, Nb and Ti are preferable, and at least one kind or more among them is (are) selected and used in a form of a single layer, a multilayer film, an alloy or the like. Note that these metals take the sodium chloride structures after being nitridation-processed. A selective etching can be performed on CrN using a solution of perchloric acid or nitric acid and ceric ammonium nitrate without damaging the group III nitride semiconductor and an Au—Sn alloy solder. A mixed solution of hydrofluoric acid and nitric acid and a hydrofluoric acid type etching solution can be respectively used for VN, ZnN and NbN, and TiN.

As a deposition method of the metal layer on the AlN template substrate or the AlN single crystal substrate, the sputtering method, the vacuum deposition method or the like is applied. A substrate temperature at the time of deposition is preferably 50° C. or higher, and to set a higher temperature is preferable in terms of the improvement of an orientation of the metal film, but, since a cooling time becomes long which results in lowering a productivity, an upper limit is about 800° C. The metal layer is deposited to have a predetermined average thickness, namely, a thickness within a range of 4 nm to 300 nm. Further preferably, the thickness is 30 nm to 200 nm since a productivity of the chemical lift-off increases.

When the average film thickness is less than 4 nm, an exposure ratio of the AlN surface being the base after the nitridation process is high, so that both the AlN base and a metal nitride microcrystal start growing when the growth of the group III nitride semiconductor layer starts, resulting that an effect of improving the crystallinity is decreased, and since a direct contact ratio between the group III nitride semiconductor layer and the AlN base layer increases, an etching solution is hard to penetrate when the chemical lift-off is performed afterward, resulting that the separation becomes difficult. Further, when the average film thickness is more than 300 nm, the nitridation processing time becomes long which leads to significantly decrease the productivity, and since a driving force for a solid phase epitaxial growth from the AlN base decreases, the crystallinity of the metal nitride layer is not sufficient, so that the crystallinity of the group III nitride semiconductor layer formed on the metal nitride layer also becomes insufficient. Note that since these points are closely related to a nitridation processing condition, they are collectively explained separately.

After the metal layer is deposited, it is introduced into a growing apparatus for the group III nitride semiconductor layer, a temperature is raised in an atmosphere of high-purity hydrogen, nitrogen or a simple substance or mixed gas of He gas and Ar gas, and high-purity ammonia gas, for example, starts to be supplied at a temperature being slightly lower than the temperature at which the metal layer starts to be nitrided. The ammonia gas is supplied in a state of mixed gas in which the aforementioned gas is used as carrier gas. The highest temperature in the nitridation process and a holding time under the temperature are respectively defined as a nitridation temperature and a nitridation time.

When the temperature is low, the nitridation reaction progresses slowly, so that there is a need to set a long processing time, and when the temperature is high, there is a need not only to make the processing time short but also to control a state where the crystal structure, the orientation and the domain rotation fluctuation within the surface are suppressed as the metal nitride buffer by using the rearrangement of atoms caused by the driving force for the solid phase epitaxial growth from the base layer. In the HVPE method, for example, when a diameter of reaction tube is about φ80 mm, a flow rate of ammonia gas is about 1000 sccm. When the metal is Cr, the gas starts to be supplied at the nitridation temperature of about 600° C. A rate of heating in a furnace is about 30° C./minute, the nitridation temperature is preferably not lower than 900° C. nor higher than 1200° C., and the nitridation time is preferably not less than 1 minute nor more than 90 minutes. The nitridation time may be appropriately adjusted within the range so that it is set to be short and long when the film thickness of the metal is thin and thick, respectively.

Figure 2:
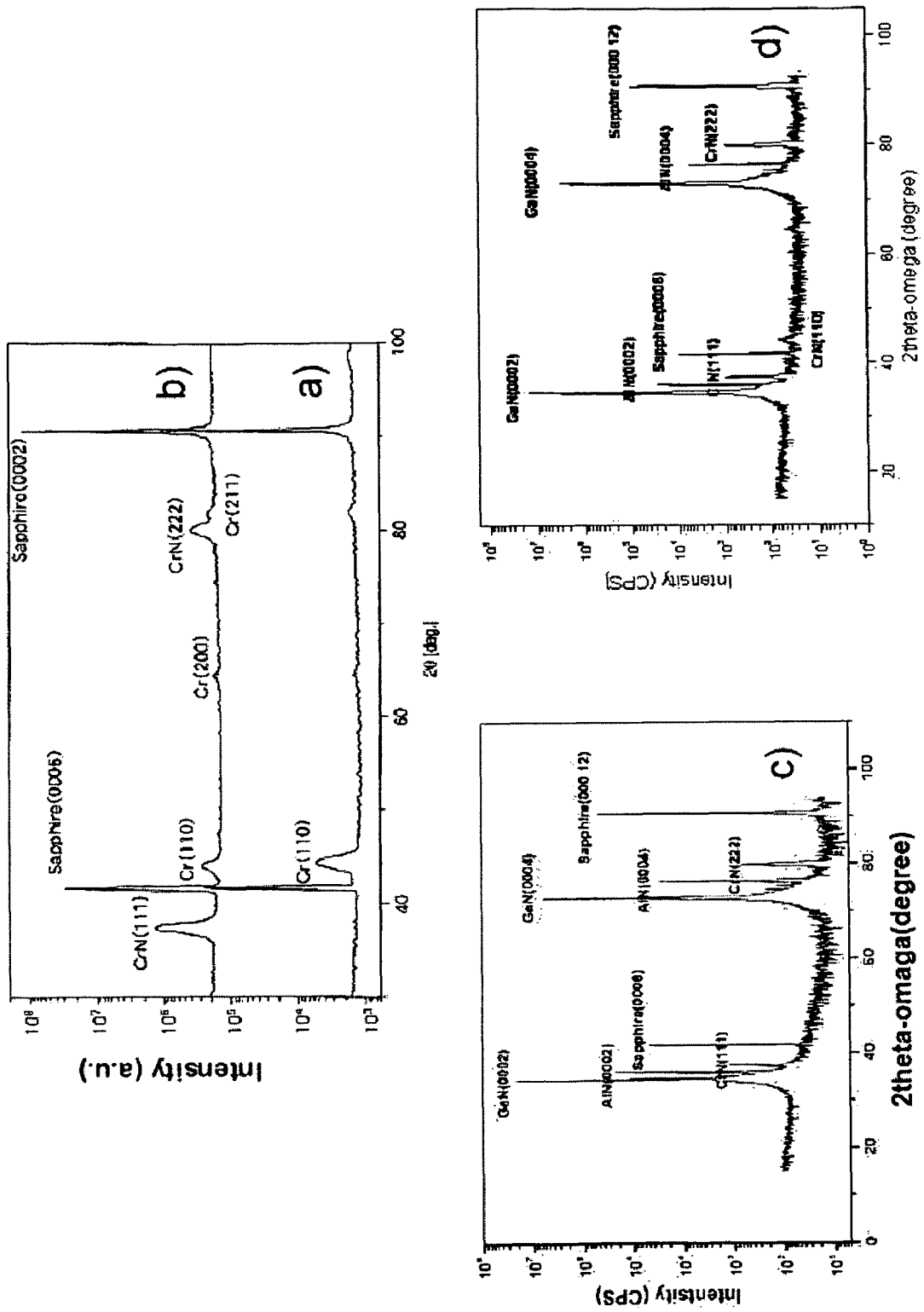
FIG. 2(a) is a graph showing an XRD pattern of a sample in which Cr with a thickness of 20 nm is deposited on a sapphire (0001) substrate.
FIG. 2(b) is a graph showing an XRD pattern of a sample being the same as that of FIG. 2(a) on which the nitridation process at 1080° C. for 3 minutes is performed.
FIG. 2(c) is a graph showing an XRD pattern of a sample in which a Cr film with a thickness of 20 nm is deposited on an AlN (0001), the nitridation process at 1080° C. for 3 minutes is performed, and GaN is grown thereafter.
FIG. 2(d) is a graph showing an XRD pattern of a sample in which a Cr film with a thickness of 200 nm is deposited on the AlN (0001), the nitridation process at 1080° C. for 30 minutes is performed, and GaN is grown thereafter.

FIGS. 2-*a* to 2-*d* show results of an X-ray diffraction at a stage where Cr of 20 nm is deposited on a sapphire substrate (FIG. 2-*a*)) in which a Cr surface is oriented in a <110> direction when being deposited, so that even the group III nitride semiconductor layer is grown under the state, the aforementioned requirements are not satisfied and the single crystal film cannot be obtained. Next, a result of an X-ray diffraction after the nitridation process is conducted under the nitridation temperature of 1080° C. for 3 minutes is shown in FIG. 2-*b*. The single crystal of the group III nitride semiconductor layer can be obtained only after the CrN surface is oriented in a <111> direction realized by the rearrangement of atoms in the nitridation process. However, in this case, it is confirmed that the <110> orientation state of Cr is remained due to the insufficient nitridation.

Meanwhile, FIG. 2-*c* shows a result of an X-ray diffraction of a sample in which after Cr having the same thickness as described above is deposited on an AlN (0001) template substrate, a nitridation process under the same condition is performed and GaN is subsequently grown thereon. In this case, only a CrN (111) peak is observed and a Cr (110) peak is not observed, and it is indicated that the rearrangement of atoms before and after the nitridation progresses faster on the AlN (0001) than on the sapphire substrate. Further, FIG. 2-*d* shows a result of an X-ray diffraction of a sample in which Cr of 200 nm is deposited on an AlN template substrate and the nitridation process is conducted at 1080° C. for 30 minutes, and thereafter, GaN is subsequently grown. In this case, since the Cr layer has a layer thickness thicker than the aforementioned one, the Cr layer is confirmed to be remained in a state of Cr metal.

Figure 3:
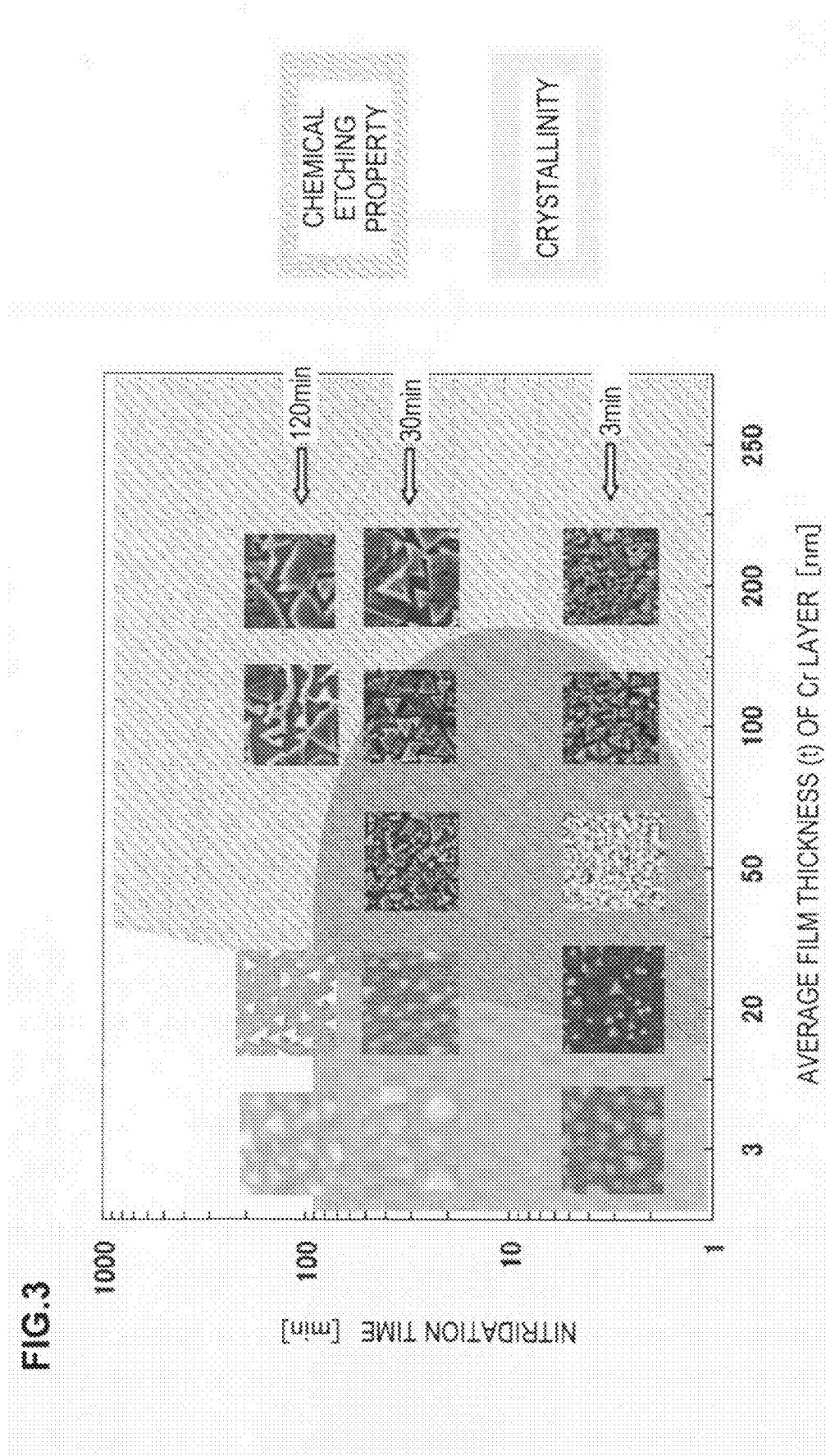
FIG. 3 is an explanatory view of an SEM observation result of a formation of a CrN microcrystal in a case where a nitridation temperature is 1080° C. and an average thickness of a Cr layer on the AlN (0001) and a nitridation time are changed.

As described above, the nitridation processing time has to be set in accordance with the thickness of the metal layer, and there are prepared samples being processed until the stage of nitridation process in which the average layer thickness of Cr deposited on the AlN (0001) template substrate is changed within a range of 4 nm to 300 nm, and the nitridation processing time is changed within a range of 3 minutes to 120 minutes. Note that the nitridation temperature is 1080° C. A result obtained by performing a SEM observation of sample surfaces is shown in FIG. 3. It is confirmed that when the Cr layer is nitridation-processed under the above temperature condition with a different period of time, a crystal formation of Cr nitride is changed depending on the initial Cr layer thickness and processing time. When the layer is thin, triangular-pyramid-shaped microcrystals are confirmed to be formed. Further, it is also confirmed that directions of bases of the triangular-pyramids are aligned. Furthermore, the bases are parallel to three a-axis directions of the AlN (0001).

Figure 4:
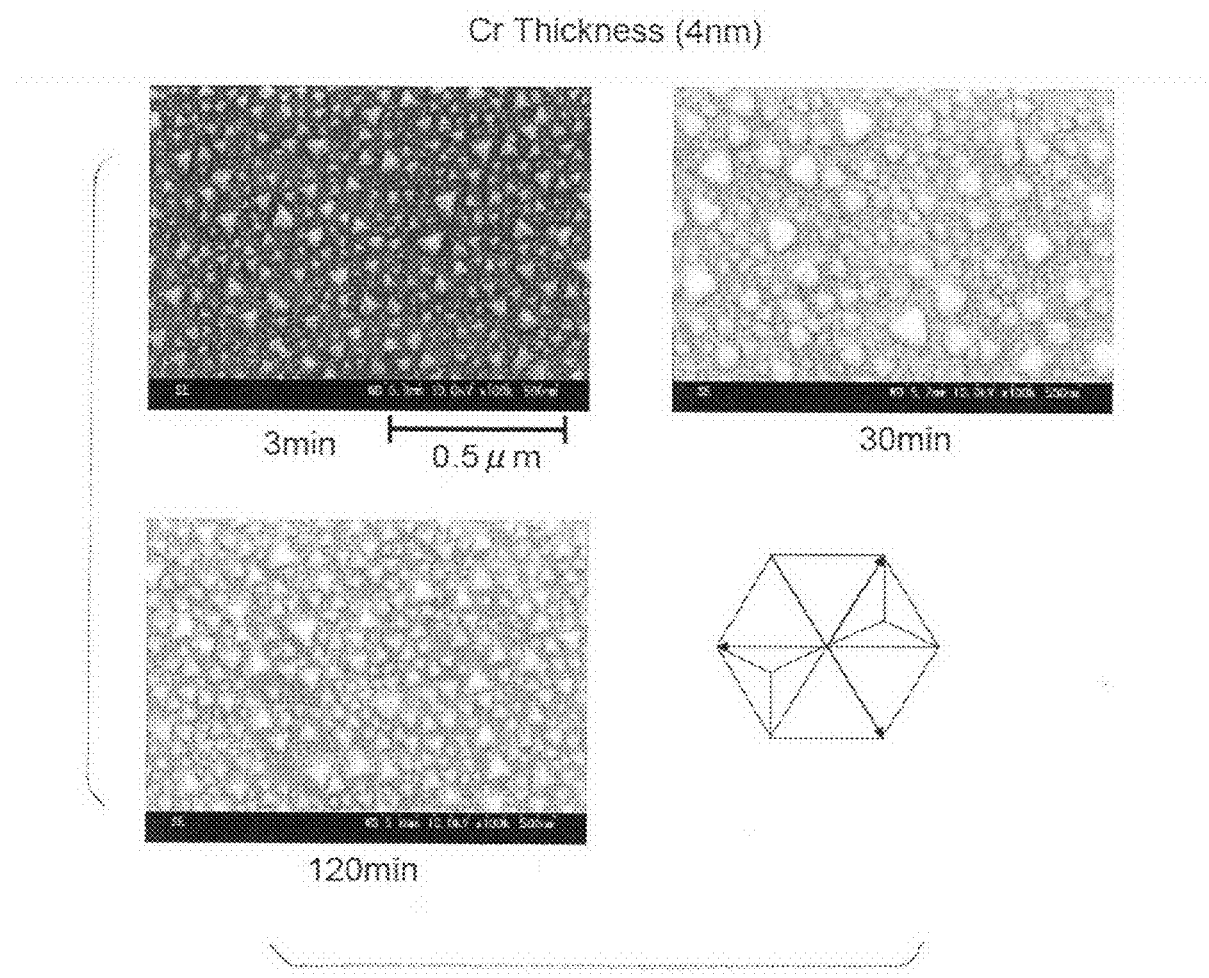
FIG. 4 are explanatory views of a change in formation of a Cr layer with an average film thickness of 4 nm on the AlN (0001) caused by the nitridation time when the Cr layer is nitrided at 1080° C., and an arrangement relationship between a shape (triangular-pyramid shape) of a microcrystal and an AlN lattice.
Figure 5:
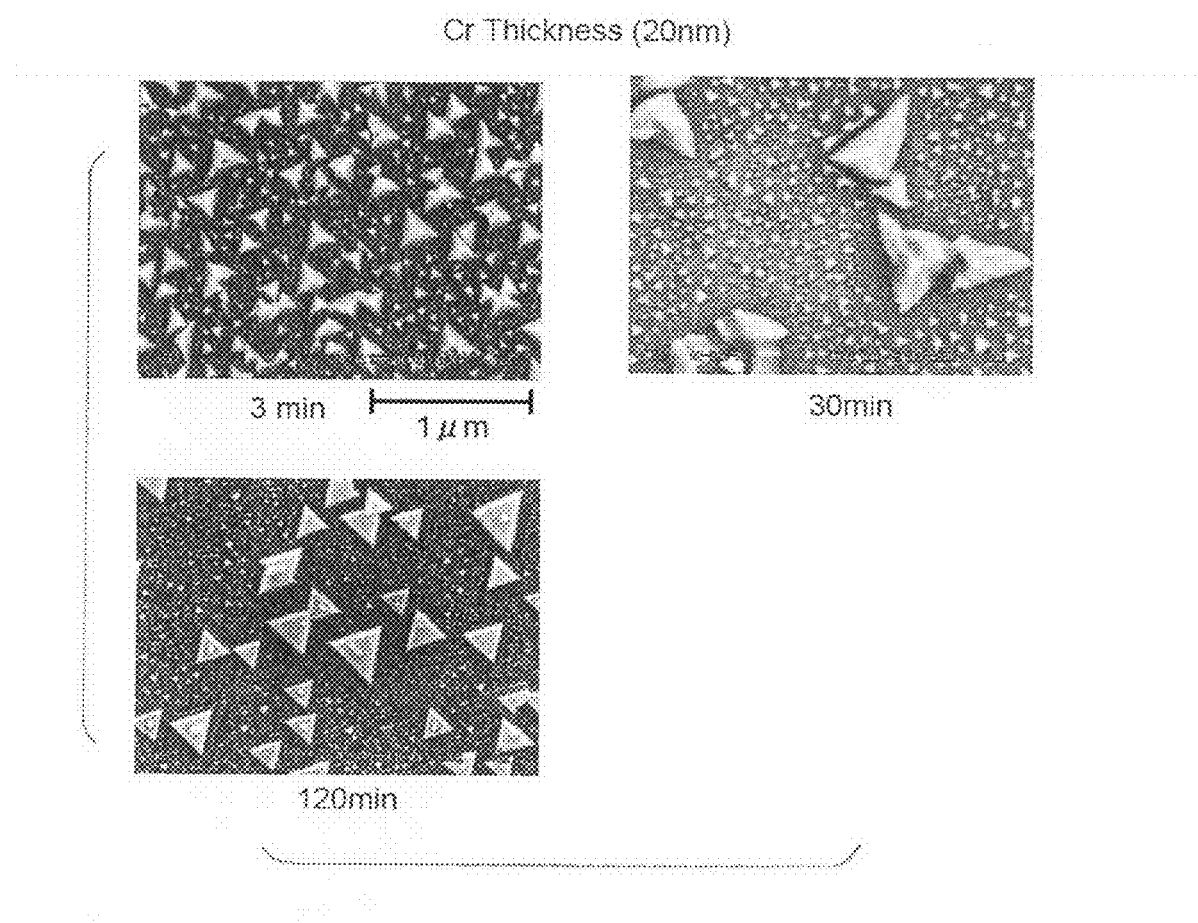
FIG. 5 are explanatory views of a change in formation of a Cr layer with an average film thickness of 20 nm on the AlN (0001) caused by the nitridation time when the Cr layer is nitrided at 1080° C.

When the film thickness is thick and the nitridation time is short, for example, when the average film thickness is 200 nm and the nitridation time is 3 minutes, since the nitridation and the rearrangement of atoms are just started, the film is confirmed to take an indeterminate form. When the layer is rather thick, by making the nitridation time long, the triangular-trapezoid shapes in which directions of bases are aligned in parallel with three a-axis directions of the AlN (0001) are formed, but, it requires an excessive nitridation processing time, in which, for example, if the nitridation process of 120 minutes is conducted, crystal grains are aggregated and enlarged due to a surface migration and the triangular-trapezoid loses its shape. Note that since a microcrystal grain in an SEM image when the initial average layer thickness of Cr is 4 nm has a very small size, the SEM image is enlarged so that the state can be observed. For further details, FIG. 4 show a change in formation caused by the nitridation time when the initial average layer thickness of Cr layer is 4 nm, and FIG. 5 show a change when the average layer thickness of Cr layer is 20 nm.

It is confirmed that although traiangular-pyramid-shaped CrN (111) microcrystals are formed in a short period of time in the Cr layers of both the average layer thicknesses, when 30 minutes of nitridation processing time has passed, the crystal grains are aggregated to be enlarged and the triangular-pyramid loses its shape due to the surface migration during the period of time. Further, if the nitridation process is continued until 120 minutes elapses, it is found that a microcrystal structure of triangle is formed again. However, as confirmed in FIG. 5, the microcrystal takes a trapezoid shape, so that it is different from the microcrystal formed in the short period of time. As a result of energy distributed EPMA analysis, it is proved that the triangular-trapezoid microcrystal is an AlCrN mixed crystal in which a surface is CrN and a base portion is Al-rich in composition. (It is also confirmed that the base portion is not dissolved by a ceric ammonium nitrate type etching solution.)

Figure 6:
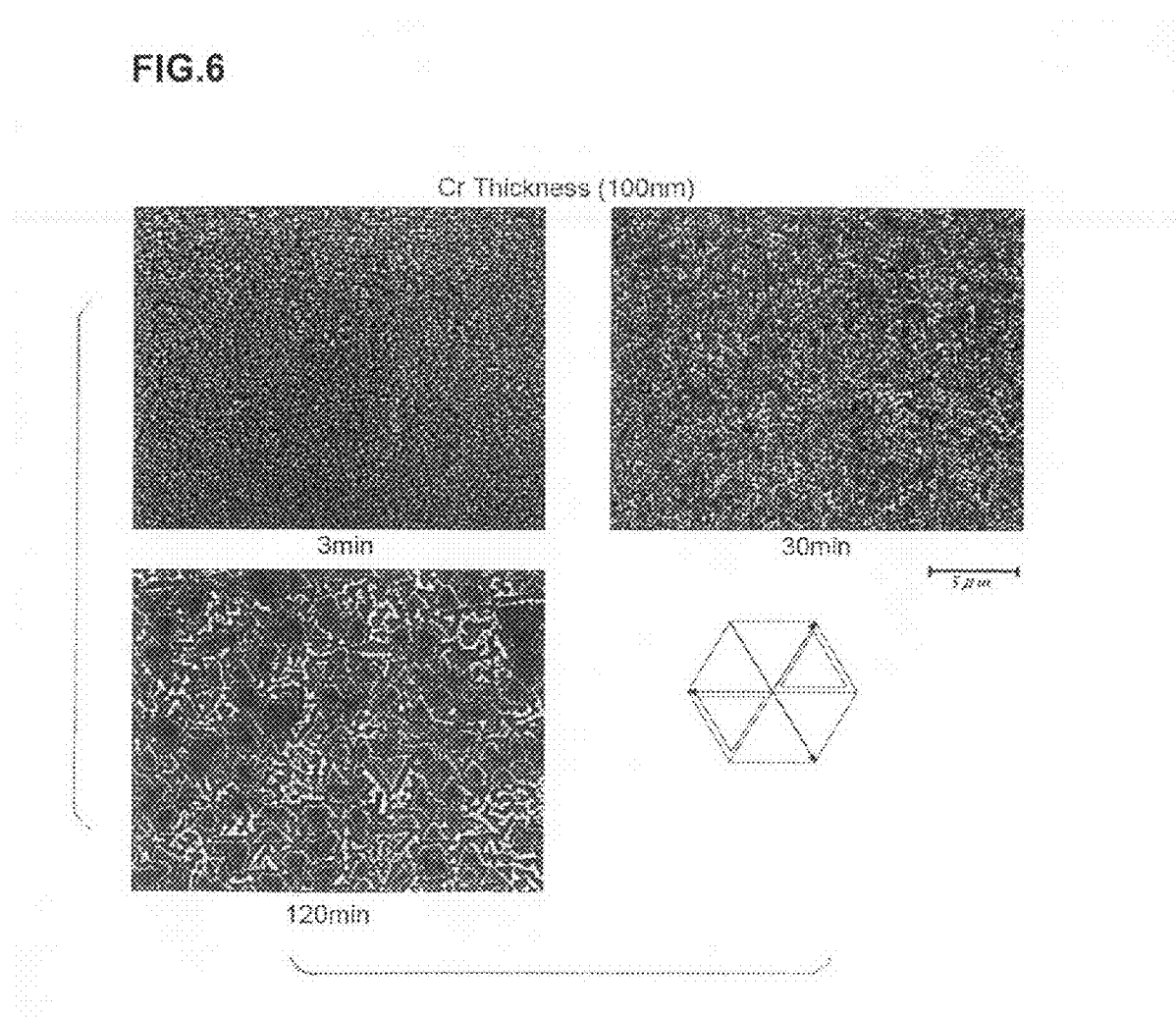
FIG. 6 are explanatory views of a change in formation of a Cr layer with an average film thickness of 100 nm on the AlN (0001) caused by the nitridation time when the Cr layer is nitrided at 1080° C., and an arrangement relationship between a shape (triangular-trapezoid shape) of a microcrystal and the AlN lattice.
Figure 7:
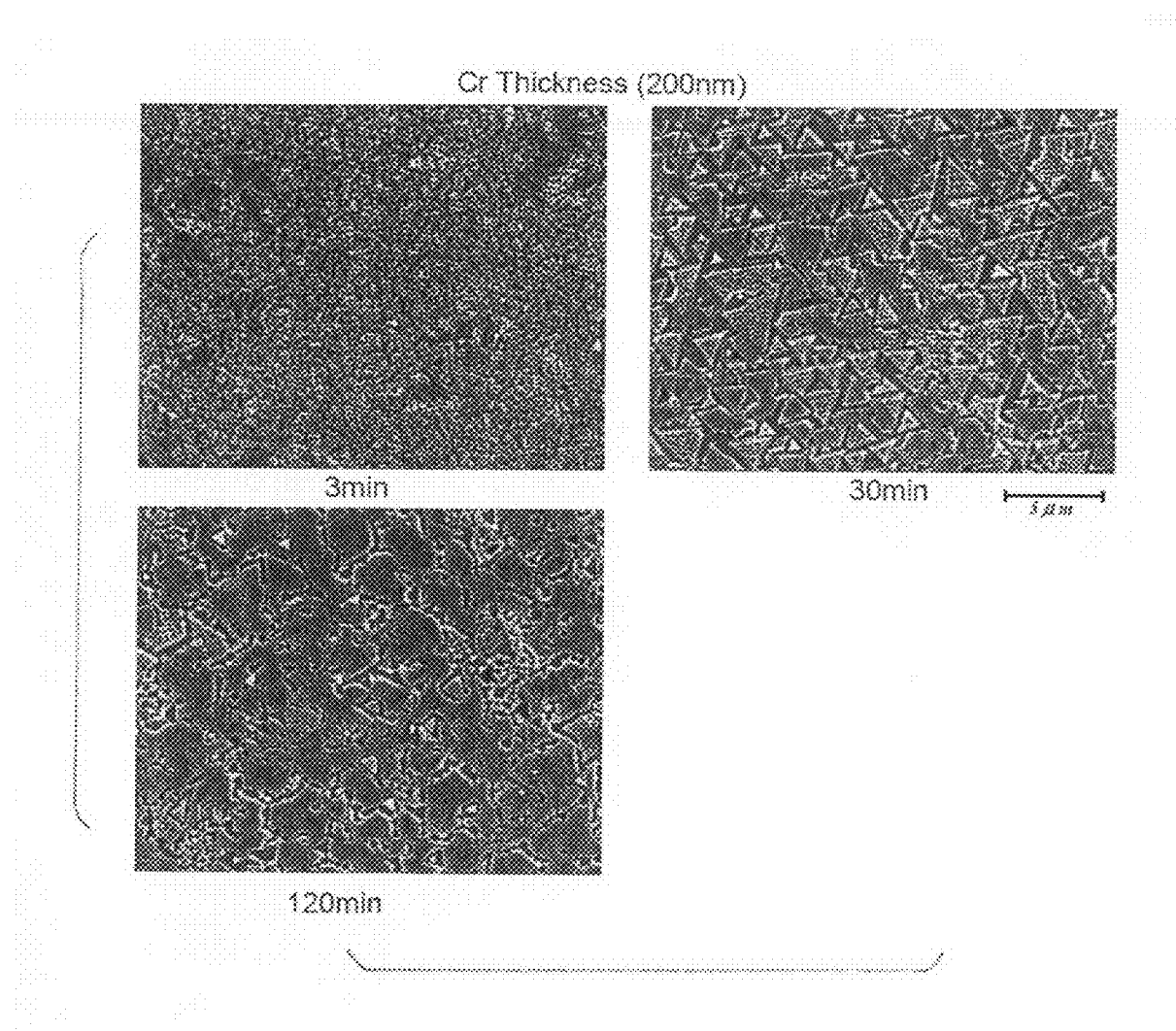
FIG. 7 are explanatory views of a change in formation of a Cr layer with an average film thickness of 200 nm on the AlN (0001) caused by the nitridation time when the Cr layer is nitrided at 1080° C.

FIGS. 6 show cases where the Cr average layer thickness is 100 nm and FIGS. 7 show cases where the Cr average layer thickness is 200 nm, and also in these cases, the triangular-trapezoid-shaped microcrystals are CrN, so that they can be dissolved by the ceric ammonium nitrate type etching solution.

As described above, the triangular-pyramid shapes or the triangular-trapezoid shapes can be obtained in which the directions of the bases are parallel to the three a-axis directions of the AlN (0001), and further, the nitridation condition to avoid the loss of shape may be appropriately set in accordance with the thickness of the metal layer. Note that the metal nitride after the nitridation according to the present invention takes a three-dimensional structure having a concave and convex as shown above, the layer thickness is defined by the average layer thickness determined by dividing an integration area of the concave and convex at a cross section by a measuring distance.

Next, a growth of the group III nitride semiconductor layer will be explained. The aforementioned nitridation process of the metal layer is conducted, a plurality of substantially triangular-pyramid-shaped or triangular-trapezoid-shaped micryocrystals are formed on the surface of the AlN (0001) template substrate, and thereafter, to grow a first layer in a growth of GaN, for example, the substrate temperature is lowered to 900° C. in the HVPE method, for instance. In this case, a flow rate condition of carrier gas is appropriately changed in order to set a V/III ratio and a growth speed. If the growth is ready to be started, hydrochloric acid gas together with the carrier gas start to be flown from an upstream side of a metal Ga heated at 850° C., thereby generating GaCl-containing raw material gas. The generated GaCl-containing raw material gas is mixed with ammonia mixed gas in the vicinity of the substrate, which is supplied on the metal nitride buffer layer, to thereby start the crystal growth of GaN. Normally, the growth is started at a point in time where 15 minutes have elapsed after the temperature is lowered to 900° C. At this time, the growth is conducted for, for example, 5 minutes at a flow rate of hydrochloric acid gas of 80 sccm. To interrupt the growth, it is only required to once stop the supply of the hydrochloric acid gas.

Subsequently, the substrate temperature is raised to 1050° C. which is a growth condition for a second layer, a gas flow rate and other conditions are set, and similarly as described above, by supplying the hydrochloric acid gas at a flow rate of, for instance, 40 sccm, the second layer of GaN layer is grown when the growth thickness reaches a desired thickness, the supply of the hydrochloric acid gas is stopped, and a cooling is started. The supply of ammonia gas is stopped when the substrate temperature reaches 600° C. or lower, and a cooling is conducted in a nitride atmosphere. After the temperature is cooled enough to take out the substrate, the substrate is taken out from the apparatus to thereby terminate the growth.

A GaN layer is grown under the aforementioned manufacturing condition on a buffer layer having a changed structural formation of CrN caused by changing a thickness of Cr layer on an AlN (0001) template substrate with a diameter of 2 inches within a range of 4 nm to 300 nm and by changing the nitridation time within a range of 1 minute to 120 minutes. The growth film thickness of GaN is 13 μm to 15 μm. A grown crystal is evaluated by the FWHM of the (0002) X-ray diffraction as an index of the fluctuation of the c-axis direction and the FWHM of the (11-20) diffraction as an index of the rotation fluctuation within the c surface (Twist). A result of (0002) diffraction and a result of (11-20) diffraction are respectively shown in FIG. 8-$a$) and FIG. 8-$b$). Note that when the Cr layer thickness is zero, it means that the Cr layer is not deposited on the AlN (0001) template and the GaN layer is directly grown.

First, as confirmed from the result of (0002) diffraction, the FWHM gradually increases until the Cr average film thickness becomes about 100 nm, but, it tends to increase significantly after the Cr average film thickness is beyond 100 nm. In a region beyond 100 nm, the tendency becomes pronounced when the nitridation time is short. It is construed that this is because the nitridation of the metal layer is not sufficiently conducted and not only the CrN (111) but also the Cr (110) are remained, as shown in FIGS. 2-$a$ to 2-$d$. When the average layer thickness of Cr layer is thick, to reduce the FWHM of (0002) diffraction, there is a need to set the longer nitridation time.

Next, in case of the (11-20) diffraction, when the Cr average layer thickness is 50 nm or smaller and the nitridation process is conducted in a short period of time, the FWHM can be largely reduced. If GaN is grown on the plurality of triangular-pyramid-shaped CrN microcrystals, when the growth is started, the GaN is grown in a lateral direction of facet faces (faces of the triangular-pyramids) of the microcrystals, and since a threading dislocation from the CrN microcrystal is hard to be propagated to the GaN crystal, the FWHM (which coincides with the dislocation density) can be reduced. When the Cr average layer thickness is beyond 100 nm, the FWHM is large in a short period of time of nitridation process, it takes the minimum value in the middle, and although it also becomes large in a long hours of nitridation process, this can be explained by corresponding to a change in a shape and formation of CrN along with the progress of the nitridation processing time previously shown in FIG. 6 and FIG. 7.

Figure 8:
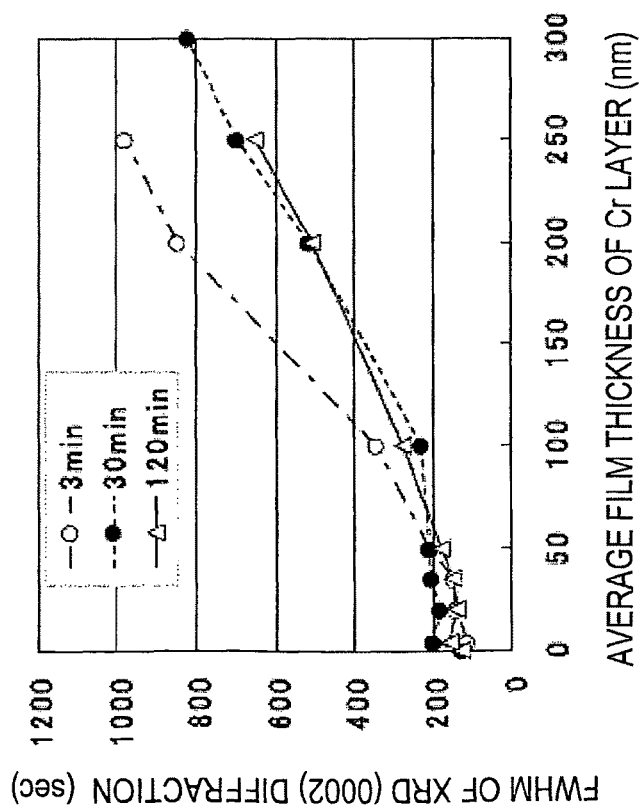
FIG. 8(a) is a graph showing a nitridation processing time dependence of a relationship between an average film thickness of a Cr layer and an FWHM of an XRD (0002) diffraction of GaN.
FIG. 8(b) is a graph showing a nitridation processing time dependence of a relationship between an average film thickness of a Cr layer and an FWHM of an XRD (11-20) diffraction of GaN.
Figure 8:
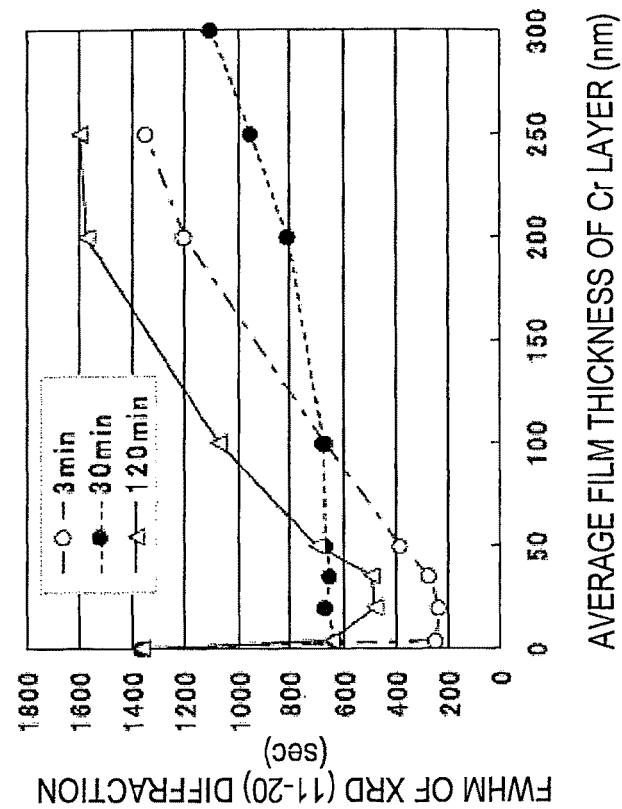

FIG. 9 show comparisons between cross section TEM images of a sample in which a GaN layer is directly grown on the AlN (0001) template substrate by the HVPE method and a sample in which a GaN layer is similarly grown on a CrN buffer layer formed by depositing a Cr layer of 20 nm on the AlN (0001) template substrate and nitrided for 3 minutes. It is confirmed that when the GaN is directly grown, dislocations generated in the AlN and the interface are propagated to the GaN layer. On the other hand, it is confirmed that the threading dislocation in the AlN is blocked so that it is almost never propagated to the GaN layer grown on the CrN buffer layer. Since the XRD FWHM of the AlN template substrate is about 100 sec in the (0002) diffraction and is 1200 sec to 1400 sec in the (11-20) diffraction, and the XRD FWHM of GaN layer which is directly grown is about 129 sec in the (0002) diffraction and is 1364 sec in the (11-20) diffraction as shown in FIGS. 8-a and 8-b, the both take substantially the same numeric value (dislocation density). Meanwhile, the XRD FWHM of the GaN layer on the CrN buffer layer is 139 sec in the (0002) diffraction and is 230 sec in the (11-20) diffraction, in which a great effect especially for reducing the twist within the surface can be confirmed.

Further, it is indicated from FIG. 8-b) that even the average layer thickness of Cr layer is either of 4 to 300 nm, compared to a case where the GaN layer is directly grown, it is possible to reduce a value of FWHM of the (11-20) diffraction by selecting an appropriate nitridation processing condition according to the respective layer thicknesses. When the Cr layer is used in the blue LED and the like, since the dislocation may not unfavorably influence to lower the light emission efficiency, the Cr layer may have a maximum thickness by placing much value on the chemical lift-off property to improve the productivity. A tolerance range of the average thickness of Cr layer becomes about seven times larger than that on the sapphire substrate.

As described above, since the change in formation of CrN due to the average thickness of Cr layer and the nitridation time, and the growth condition for the GaN layer on the CrN are understood, an influence of the crystallinity of the used AlN (0001) template on the crystallinity of the GaN layer is examined. Each of the AlN templates used for the comparison are grown on sapphire (0001) surfaces, in which the thickness of AlN layer is within a range of 0.1 to 12.5 μm, and the XRD FWHM of the AlN layer is within a range of 50 sec to 280 sec in the (0002) diffraction and is within a range of 550 sec to 2850 sec in the (11-20) diffraction. A Cr layer with the average layer thickness of 35 nm is deposited on the AlN (0001) template by a sputtering method, and after it is introduced into an HVPE apparatus, a GaN layer of 12 to 14 μm is grown under the same condition as described above except that the nitridation processing time is 5 minutes.

FIGS. 10-a and 10-b show a relationship between the XRD FWHM of the used AlN template and the XRD FWHM of the grown GaN layer. First, in the (0002) diffraction being an index of the fluctuation of the c axis, the XRD FWHM of the GaN layer becomes substantially in proportion to the FWHM of the used AlN layer, as shown in FIG. 10-a). (The FWHM increases as much as about 20 to 50 sec.) Therefore, to reduce the fluctuation of the c axis, it is preferable to use AlN having a narrow XRD FWHM. Next, in the FWHM of the (11-20) diffraction being an index of the domain rotation within the surface, because of the suppression effect of the threading dislocation of the triangular-pyramid-shaped CrN previously shown, the FWHM of the GaN layer is largely decreased, but, it is found that when the FWHM of the used AlN is beyond 2500 sec, the suppression effect is reduced.

As described above, in order to grow a GaN layer having a good crystallinity, the used AlN (0001) template substrate or the single crystal preferably has the XRD FWHM of 200 sec or lower and 2500 sec or lower in the (0002) diffraction and in the (11-20) diffraction, respectively.

Figure 11:
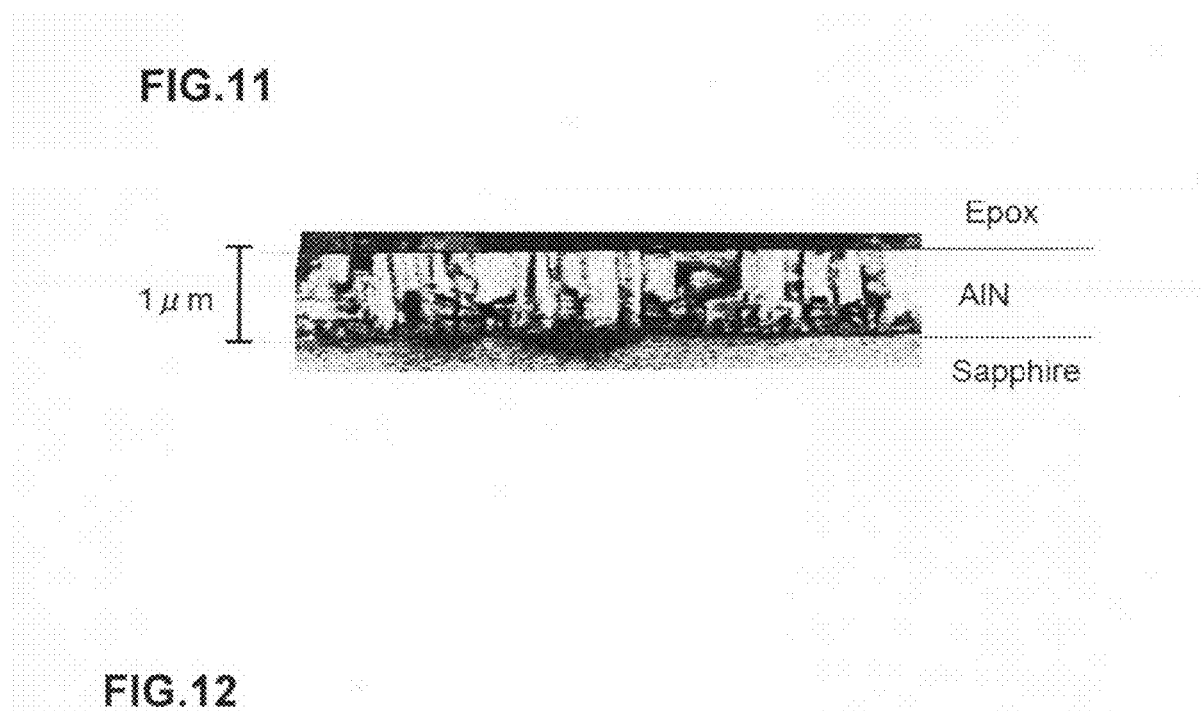
FIG. 11 is a cross section TEM picture of an AlN layer on a sapphire substrate.

Further, a cross section TEM picture of an AlN layer is shown in FIG. 11, in which the AlN layer preferably has a thickness of 0.1 μm or more, since when the thickness of AlN layer on the sapphire substrate is less than 0.1 μm, a lot of dislocations generated in the AlN growth interface are in the middle of a dislocation-disappearing phenomenon caused by a reaction of each dislocation and therefore the effect of introducing the CrN buffer layer is reduced. Further, in case of the template, when the thickness of the AlN layer is beyond 10 μm, the productivity for manufacturing the templates is significantly decreased, so that the thickness is preferably 10 μm or less.

At last, the chemical lift-off property of the samples described in the above paragraphs will be explained. When GaN is directly grown without introducing the Cr layer, the etching is not conducted, of course, and when the Cr layer is thin, the nitridation of the metal completes in a short period of time, the formation of triangular-pyramid shape in the solid phase epitaxial growth also completes in a short period of time, and a size of each triangular-pyramid is also small. However, when the excessive nitridation is continued, the enlargement of the crystal grain is occurred due to the surface migration. To enlarge the crystal grain, the surrounding microcrystals have to supply the atoms, so that the portion on the AlN surface is exposed. Accordingly, even if GaN grows in the lateral direction of the facet faces of the CrN microcrystals, the AlN surface and the GaN layer directly contact and adhere to each other, which significantly prevents the penetration of the etching solution, resulting that it takes time for the separation by the etching, or, in some cases, the separation by the etching becomes impossible. Therefore, the exposure ratio of AlN is preferably a predetermined area ratio or smaller, but, it is difficult to digitize in general if a state of the exposed portion is changed by many factors such as a size, a continued or discontinued state and an interval of the respective exposed portions. In a sample where a GaN layer is grown on a Cr layer which is processed under the nitridation temperature of 1080° C. with a different average film thickness and the nitridation processing time, a region in which the GaN layer and the AlN template substrate can be separated by the chemical etching is shown by half-tone dot meshing region with oblique lines in FIG. 3. Further, a region having a good crystallinity is shown by a gray region. This is a case where the nitridation temperature is 1080° C., and if the nitridation temperature and the nitridation processing time are adjusted in accordance with the respective layer thicknesses and kind of metals within a range of claims, the separation using the etching can be conducted with respect to the metal layer with thinner film thickness, and also in the thick metal layer, the crystallinity can be improved. This will be explained in Examples below.

As described above, the results regarding Cr on the AlN (0001) on the sapphire substrate have been described, but, the same effect as of Cr can be obtained if V or Nb in which a metal layer indicates a face-centered cubic (110) orientation at the time of being deposited on the template substrate or the substrate and is changed to take the sodium chloride structure after the nitridation process to be oriented to a (111) direction, or Zr or Ti in which a hexagonal closest packing structure is formed at the deposition stage and is changed to the sodium chloride structure by the nitridation process to be oriented in a (111) direction, is used.

As above, the present invention has been specifically described in the embodiment by indicating the concrete examples, but, the present invention is not limited to the above-described embodiment of the invention, and various changes and modifications can be made without departing the scope of the present invention.

EXAMPLE

Hereinafter, Examples regarding the above-described group III nitride semiconductor layer, the independent substrate or the semiconductor element of the group III nitride semiconductor, and a manufacturing method thereof will be explained.

Example 1

An AlN (0001) template on a sapphire substrate having an FWHM of an XRD (0002) diffraction of about 100 sec and an FWHM of a (11-20) diffraction of about 1200 sec to 1400 sec is used. A thickness of AlN layer is 1.0 μm. After a Cr layer with an average layer thickness of 35 nm is deposited on an AlN (0001) surface, it is introduced into an HVPE apparatus and a CrN layer is formed under a nitridation processing temperature of 1095° C. and a nitridation time of 1 minute, and thereafter, a GaN layer of 12 μm is grown. The obtained crystal has the FWHM of the XRD (0002) diffraction of 121 sec and the FWHM of the (11-20) diffraction of 210 sec, which indicates a very good crystallinity. When a scribe line is formed in a square of 300 μm, and the CrN layer is etched using a ceric ammonium nitrate type etching solution of 80° C., the etching is completed in about 8 minutes, and the GaN layer can be separated. On a (000-1) N (nitrogen) surface of the GaN layer, a pit having an inverted triangular-pyramid shape of a size in which a length of bases is about 20 nm to about 400 nm as a main body, is observed.

Example 2

A GaN layer is grown under the same condition as in the Example 1 except that the average film thickness of Cr layer is 50 nm, and the nitridation temperature is 1110° C. The obtained crystal has the FWHM of the XRD (0002) diffraction of 128 sec and the FWHM of the (11-20) diffraction of 250sec, which indicates that the crystallinity is improved and is very good compared to the crystallinity of the Cr layer with the average film thickness of 50 nm under 1080° C. shown in FIGS. 8-a and 8-b. When a scribe line is formed in a square of 300 μm, and the CrN layer is etched using a ceric ammonium nitrate type etching solution of 80° C., the etching is completed in about 5 minutes, and the GaN layer can be separated. On a (000-1) N (nitrogen) surface of the GaN layer, a pit having an inverted triangular-pyramid shape in which a length of bases is about 30 nm to about 500 nm as a main body, is observed.

Example 3

A GaN layer is grown under the same condition as in the Example 1 except that the average film thickness of Cr layer is 100 nm, and the nitridation time is 4 minutes. The obtained crystal has the FWHM of the XRD (0002) diffraction of 162 sec and the FWHM of the (11-20) diffraction of 420 sec, which indicates that the crystallinity is improved and is very good compared to the crystallinity of the Cr layer with the average film thickness of 100 nm under 1080° C. shown in FIGS. 8-a and 8-b. When a scribe line is formed in a square of 300 μm, and the CrN layer is etched using a ceric ammonium nitrate type etching solution of 80° C., the etching is completed in about 3 minutes, and the GaN layer can be separated. On a (000-1) N (nitrogen) surface of the GaN layer, a dent in an inverted triangular-trapezoid shape having a pit of an inverted triangular-pyramid shape in which a length of bases is about 30 nm to about 500 nm as a main body, is observed.

Example 4

A GaN layer is grown under the same condition as in the Example 1 except that the average film thickness of Cr layer is 150 nm, the nitridation time is 7 minutes, and a growth thickness of the GaN layer is 530 μm. When a selective etching is performed on the CrN layer from a side surface of the obtained substrate with a diameter of 2 inches using a ceric ammonium nitrate type etching solution of 80° C., the etching is completed in 8 hours, and a GaN independent substrate with a diameter of 2 inches can be obtained in a crack-free manner. The GaN layer in a state where the sapphire substrate is removed has the FWHM of the XRD (0002) diffraction of 73 sec and the FWHM of the (11-20) diffraction of 82 sec, which indicates a very good crystallinity. Further, on a (000-1) N (nitrogen) surface of the GaN layer, an inverted triangular-pyramid-shaped pit in which a length of bases is about 50 nm to about 700 nm, or an inverted triangular-trapezoid-shaped dent is generated.

Example 5

A GaN layer is grown under the same condition as in the Example 3 except that the growth film thickness of GaN layer is 165 μm. The obtained GaN layer has the FWHM of the XRD (0002) diffraction of 94 sec and the FWHM of the (11-20) diffraction of 98 sec, which indicates a very good crystallinity. Further, on the GaN layer, a sacrificial epitaxial growth assuming an InGaN-type LED structure is conducted by an MOCVD method. A thickness of a stacked portion including a GaN buffer layer is about 5 μm. Since it is a check test for confirming only a removability, a device electrode is not processed, but, When the CrN layer is etched from a side surface of a substrate of 2 inches using a ceric ammonium nitrate type etching solution of 80° C., the GaN layer can be separated in about 11 hours in a crack-free manner. On a (000-1) N (nitrogen) surface of the GaN layer, a dent in an inverted triangular-trapezoid shape having a pit of an inverted triangular-pyramid shape in which a length of bases is about 30 nm to about 600 nm as a main body, is observed.

Comparative Example 1

In the Example 1, Cr is not deposited on the AlN template and a group III nitride (GaN, for example) is directly grown without conducting a nitridation processing step. A condition after the GaN starts growing is the same as that of the Example 1. When the crystallinity of the obtained GaN layer is evaluated by the FWHM of the XRD (0002) diffraction and that of the (11-20) diffraction, the FWHM of the (0002) diffraction is 129 sec and that of the (11-20) diffraction is 1364 sec. As seen from the above, in each of the Examples 1 to 5, the FWHM of the (11-20) diffraction is largely decreased and the crystallinity is improved. Further, since no CrN layer is provided, it is impossile to separate the GaN layer using the chemical etching.

Comparative Example 2

Figure 12:
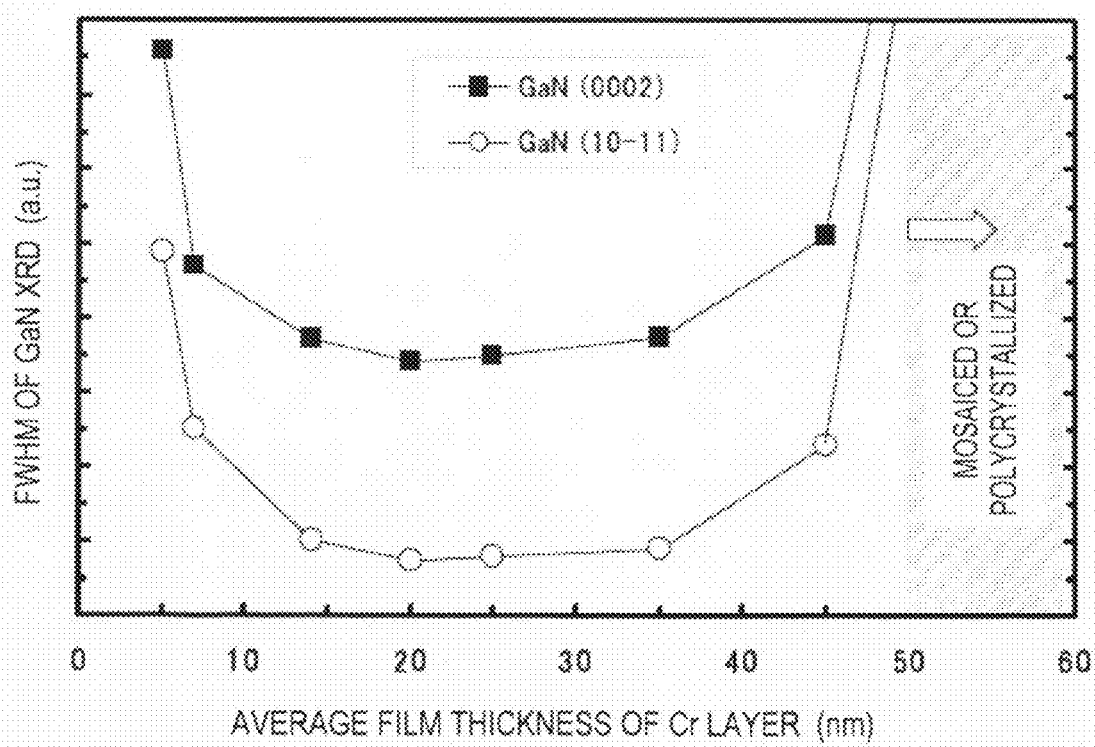
FIG. 12 is a graph showing a dependence of an XRD FWHM of a GaN crystal on an average thickness of a Cr layer on a sapphire (0001) substrate.

Cr is deposited on a sapphire (0001) substrate using a sputtering method, the nitridation process is conducted under the nitridation temperature of 1080° C. for 30 minutes, and thereafter, GaN is grown. The initial Cr average layer thickness is preferably 10 to 40 nm, in which when the thickness is less than 10 nm, the crystallinity is deteriorated, and when it is 50 nm or more, the CrN layer and GaN grown thereon are mosaiced or polycrystallized as shown in FIG. 12 (from Application number 2006-272321 which includes the present inventor). Therefore, compared to a working range of the present application, a range of thickness at which the triangular-pyramid-shaped CrN is favorably formed is narrow, and a required nitridation time is long. The FWHM of the (0002) diffraction falls within a range of about 240 sec to 560 sec. and the FWHM of the (10-11) or the (11-20) diffraction is within a range of about 370 sec to 650 sec, in which even the FWHM of the best value takes about twice to four times the FWHM of the Examples. The maximum film thickness of the Cr layer at which the single crystal film can be obtained is about one-seventh of that of the present application, and there remains a problem of how to deal with the improvement of crystallinity, the enlargement of diameter and the mass production.

As apparent from the Examples 1 to 5 and the Comparative Example 1, by providing the CrN layer on AlN, the FWHM of the (11-20) diffraction is largely decreased and the crystallinity is improved in each of the Examples. Further, when the metal nitride layer is not provided in the first place, the selective chemical etching cannot be principally performed, so that the separation of GaN layer is impossible. Further, as apparent from the Comparative Example 2 and the Examples, the Cr layer on the AlN has a good crystallinity after the nitridation and the maximum growth thickness of the single crystal film can be, about 7 times thicker compared to on the sapphire. Accordingly, it is possible to easily perform the reduction in the crystal defect and separation of the group III nitride layer using the chemical etching.

What is claimed is:
1. A manufacturing method of a group III nitride semiconductor, comprising:
depositing a metal layer not comprised of a group III metal on a AlN (0001) surface of:
(a) an AlN template substrate formed by depositing an AlN single crystal layer with a thickness of not less than 0.1 μm nor more than 10 μm on a substrate made of either one of sapphire, SiC (silicon carbide), and Si (silicon), or
(b) an AlN single crystal substrate;
forming a metal nitride layer having a plurality of substantially triangular-pyramid-shaped or triangular-trapezoid-shaped metal nitride microcrystals by performing a heating nitridation process on the metal layer under a mixed gas atmosphere of ammonia; and
depositing a group III nitride semiconductor layer on the metal nitride layer.

2. The manufacturing method of the group III nitride semiconductor according to claim 1, further comprising:
forming an independent substrate or a semiconductor element of the group III nitride semiconductor by dissolving and removing the metal nitride layer using a chemical etching and separating the AlN template substrate or the AlN single crystal substrate from the group III nitride layer.

3. The manufacturing method of the group III nitride semiconductor according to claim 1,
wherein an FWHM of a (0002) X-ray rocking curve of the AlN template substrate or the AlN single crystal substrate is 200 seconds or less and an FWHM of (11-20) is 2500 seconds or less.

4. The manufacturing method of the group III nitride semiconductor according to claim 1,
wherein the metal layer is either one of a single layer film, a multilayer film and an alloy film containing at least one kind or more selected from Cr (chromium), V (vanadium), Zr (zirconium), Nb (niobium) and Ti (titanium).

5. The manufacturing method of the group III nitride semiconductor according to claim 1,
wherein a heating nitridation temperature under the mixed gas atmosphere of ammonia is within a range of 900 to 1200 ° C. and a nitridation time is not less than 1 minute nor more than 90 minutes.

6. The manufacturing method of the group III nitride semiconductor according to claim 1,
wherein an average thickness of the metal layer before said heating nitridation process falls within a range of 4 to 300 nm.

7. The manufacturing method of the group III nitride semiconductor according to claim 1, wherein the metal layer is deposited on the AlN template substrate or the AlN single crystal substrate using a sputtering method or a vacuum deposition method.

8. The manufacturing method of the group III nitride semiconductor according to claim 1, wherein the forming of the metal nitride layer comprises orienting a surface of the metal nitride microcrystals in a <111>direction.

9. The manufacturing method of the group III nitride semiconductor according to claim 1, wherein the forming of the metal nitride layer comprises positioning bases of the metal nitride microcrystals in a direction parallel to three a-axis directions of the AlN (0001) surface.

10. A group III nitride semiconductor, comprising:
a group III nitride semiconductor layer deposited on a metal nitride layer, said metal nitride layer having a plurality of substantially triangular-pyramid-shaped or triangular-trapezoid-shaped metal nitride microcrystals,
wherein said metal nitride layer is formed by performing a heating nitridation process under a mixed gas atmosphere of ammonia on a metal layer not comprised of a group III metal deposited on a AlN (0001) surface of:
(a) an AlN template substrate formed by depositing an AlN single crystal layer with a thickness of not less than 0.1 μm nor more than 10 μm on a substrate made of either one of sapphire, SiC (silicon carbide), and Si (silicon), or
(b) an AlN single crystal substrate.

11. The group III nitride semiconductor according to claim 10,
wherein an FWHM of a (0002) X-ray rocking curve of the AlN template substrate or the AlN single crystal substrate is 200 seconds or less, and an FWHM of (11-20) is 2500 seconds or less.

12. The group III nitride semiconductor according to claim 10,
wherein said metal nitride contains at least one kind or more selected from Cr (chromium), V (vanadium), Zr (zirconium), Nb (niobium) and Ti (titanium).

13. The group III nitride semiconductor according to claim 10,
wherein an average thickness of said metal nitride layer falls within a range of 6 to 450 nm.

14. A group III nitride independent substrate formed by dissolving and removing said metal nitride layer from said group III nitride semiconductor according to claim 10 using a chemical etching, comprising
a substantially triangular-pyramid-shaped or triangular-trapezoid-shaped pit or dent on a (000-1) N (nitrogen) polarity surface.

15. A group III nitride semiconductor element, comprising
a substantially triangular-pyramid-shaped or triangular-trapezoid-shaped pit or dent on a (000-1) N (nitrogen) polarity surface being a surface from which said metal nitride layer in said group III nitride semiconductor according to claim 10 is dissolved and removed by a chemical etching.

16. The group III nitride semiconductor according to claim 10, wherein a surface of the metal nitride microcrystals on the formed a metal nitride layer is oriented in a <111>direction.

17. The group III nitride semiconductor according to claim 10, wherein bases of the metal nitride microcrystals are parallel to three a-axis directions of the AlN (0001) surface.

* * * * *